(12) United States Patent
Sun et al.

(10) Patent No.: US 11,139,412 B2
(45) Date of Patent: Oct. 5, 2021

(54) ELECTRICAL COUPLING ASSEMBLIES AND METHODS FOR OPTOELECTRONIC MODULES

(71) Applicant: FINISAR CORPORATION, Sunnyvale, CA (US)

(72) Inventors: Tao Sun, Shanghai (CN); Feng Wang, Shanghai (CN); Wei Peng Nian, Shanghai (CN); Ting Shi, Shanghai (CN); Bing Qiu, Shanghai (CN); Shao Jun Yu, Shanghai (CN)

(73) Assignee: II-VI DELAWARE, INC., Wilmington, DE (US)

( * ) Notice: Subject to any disclaimer, the term of this patent is extended or adjusted under 35 U.S.C. 154(b) by 0 days.

(21) Appl. No.: 16/419,950

(22) Filed: May 22, 2019

(65) Prior Publication Data

US 2020/0357946 A1 Nov. 12, 2020

(30) Foreign Application Priority Data

May 8, 2019 (CN) .......................... 201910381226.3

(51) Int. Cl.
*H01L 31/12* (2006.01)
*H01L 23/00* (2006.01)
*G02B 6/42* (2006.01)

(52) U.S. Cl.
CPC .............. *H01L 31/12* (2013.01); *H01L 24/48* (2013.01); *H01L 24/85* (2013.01); *G02B 6/428* (2013.01); *G02B 6/4279* (2013.01); *H01L 2224/48227* (2013.01); *H01L 2224/48465* (2013.01); *H01L 2224/85986* (2013.01); *H01L 2924/12042* (2013.01); *H01L 2924/12043* (2013.01)

(58) Field of Classification Search
None
See application file for complete search history.

(56) References Cited

U.S. PATENT DOCUMENTS

| | | | | |
|---|---|---|---|---|
| 6,583,483 | B2* | 6/2003 | Masumoto | H01L 23/49838 257/459 |
| 7,064,433 | B2* | 6/2006 | Wong | H01L 24/85 257/737 |
| 10,438,916 | B2* | 10/2019 | She | H01L 24/48 |
| 2019/0020320 | A1* | 1/2019 | Nallani | H03F 3/45475 |
| 2019/0051627 | A1* | 2/2019 | She | H01L 24/48 |

* cited by examiner

*Primary Examiner* — Long Pham
(74) *Attorney, Agent, or Firm* — Blank Rome LLP

(57) ABSTRACT

In one example embodiment, a PCBA, an optoelectronic module, an electrical coupling, and/or a high speed interconnect may include a first contact pad, a second contact pad adjacent to and spaced apart from the first contact pad, a first wire coupled to the first contact pad via a first ball bump, and a second wire coupled to the second contact pad via a double ball bump.

19 Claims, 6 Drawing Sheets

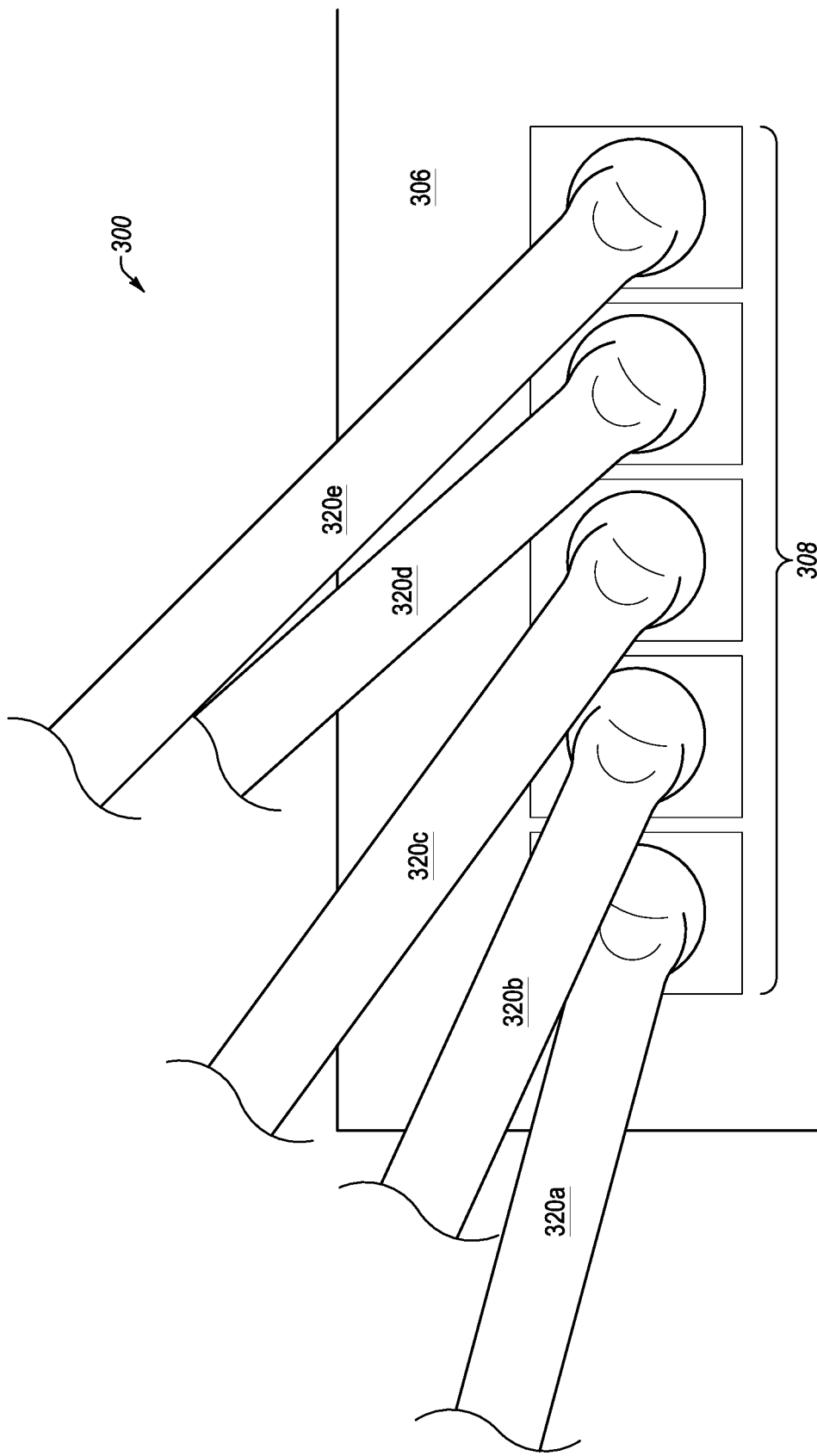

ELECTRICAL COUPLING ASSEMBLIES AND METHODS FOR OPTOELECTRONIC MODULES

CROSS-REFERENCE TO RELATED APPLICATIONS

This application claims priority to Chinese Application No. 201910381226.3, filed May 8, 2019, entitled ELECTRICAL COUPLING ASSEMBLIES AND METHODS FOR OPTOELECTRONIC MODULES, which is incorporated by reference in its entirety.

BACKGROUND

The present disclosure generally relates to electrical couplings for printed circuit board assemblies and/or optoelectronic modules.

Although printed circuit board assemblies may be implemented in a variety of configurations for many difference purposes, in some circumstances printed circuit board assemblies may be implemented in optoelectronic modules.

Optoelectronic modules, such as transceivers, are increasingly used to transmit data between different devices or different locations. In particular, optical signals maybe used to rapidly communication data (via the optical signals) between different devices or different locations. However, most electronic devices operate using electrical signals. Accordingly, optoelectronic modules may be used to convert optical signals to electrical signals and/or convert electrical signals to optical electrical, so optical signals may be used to transmit data between electronic devices. Optoelectronic modules typically communicate with a host device by transmitting electrical signals to the host device and receiving electrical signals from the host device. These electrical signals may then be transmitted by the optoelectronic module as optical signals.

Some optoelectronic modules include multiple integrated circuits (ICs) to perform various tasks, such as modulating signals (e.g., for components such as transmitters and receivers). One difficulty with the inclusion of multiple ICs is electrically coupling the electrical contacts on the ICs in a relatively small area, while maintaining electrical couplings with suitable performance between the contacts.

As the density of components increases, components such as ICs may be positioned closer to one another, as well as the electrical connections coupling them together. However, designing and manufacturing higher density printed circuit board assemblies and/or optoelectronic modules may lead to additional challenges.

The claimed subject matter is not limited to embodiments that solve any disadvantages or that operate only in environments such as those described above. This background is only provided to illustrate examples of where the present disclosure may be utilized.

SUMMARY

The present disclosure generally relates to electrical couplings for printed circuit board assemblies and/or optoelectronic modules.

In one example embodiment, a PCBA, an optoelectronic module, an electrical coupling, and/or a high speed interconnect may include a first contact pad, a second contact pad adjacent to and spaced apart from the first contact pad, a first wire coupled to the first contact pad via a first ball bump, and a second wire coupled to the second contact pad via a double ball bump.

In some embodiments, the double ball bump may include a second ball bump positioned on the second contact pad, and a third ball bump positioned over the second ball bump. The combination of the second ball bump and the third ball bump may space the second wire from the second contact pad more than the first ball bump spaces the first wire from the first contact pad. The first wire may be stitched to the first ball bump and the second wire may be stitched to the double ball bond.

The first contact pad and the second contact pad may be positioned on an integrated circuit positioned over a substrate. The integrated circuit may include a driver electrically coupled to an optical transmitter or an amplifier electrically coupled to an optical receiver.

The first wire may be coupled to a third contact pad on the substrate and the second wire may be coupled to a fourth contact pad on the substrate. A pitch between the third contact pad and the fourth contact pad may be greater than a pitch between the first contact pad and the second contact pad.

The double ball bump may be about twice as tall as the first ball bump. The combination of the first ball bump and the double ball bump may space the first wire from the second wire. The first wire and the second wire may be angled with respect to one another, and the combination of the first ball bump and the double ball bump may provide sufficient clearance for angles of the first wire and the second wire.

Another example embodiment includes a method of forming a PCBA, an optoelectronic module, an electrical coupling, and/or a high speed interconnect. The method may include forming a first ball bump on a contact pad of an integrated circuit, forming a second ball bump on the first ball bump; and stitching a wire to the second ball bump.

The method may include disconnecting a bonding tool from the first ball bump prior to forming the second ball bump. The method may include forming a third ball bump on a second contact pad of a substrate. The integrated circuit may be positioned over and mechanically coupled to the substrate. The method may include extending a wire from the third ball bump along a predefined route to the second ball bump to electrically couple the contact pad of the integrated circuit with the second contact pad of the substrate. The method may include disconnecting a bonding tool from the second ball bump prior to forming the third ball bump. The method may include forming a third ball bump on a second contact pad of the integrated circuit. And stitching a second wire to the third ball bump on the second contact pad. The second contact pad may be positioned adjacent to and spaced apart from the contact pad.

In another example embodiment, a method may include coupling a first wire to a first contact pad of an integrated circuit and coupling a second wire to a second contact pad adjacent to and spaced apart from the first contact pad.

Coupling the first wire to the first contact pad may include forming a first ball bump on the first contact pad of the integrated circuit, forming a second ball bump on the first ball bump, and stitching the first wire to the second ball bump. Coupling the second wire to the second contact pad may include forming a third ball bump on the second contact pad of the integrated circuit, and stitching a second wire to the third ball bump.

In some aspects, the first wire may be positioned further from the first contact pad than the second wire is positioned from the second contact pad as a result of the first ball bump and the second ball bump. The first ball bump and the second ball bump combined may be larger than the third ball bump.

The method may include ball bonding the first wire to a third contact pad of a substrate prior to stitching the first wire to the second ball bump, and ball bonding the second wire to a fourth contact pad of the substrate prior to stitching the second wire to the third ball bump. In some aspects, the integrated circuit may be positioned over and mechanically coupled to the substrate.

This Summary introduces a selection of concepts in a simplified form that are further described below in the Detailed Description. This Summary is not intended to identify key features or essential characteristics of the claimed subject matter, nor is it intended to be used as an aid in determining the scope of the claimed subject matter.

BRIEF DESCRIPTION OF THE DRAWINGS

FIG. 3A is a top view of a portion of yet another example of a printed circuit board assembly.

DETAILED DESCRIPTION

Reference will be made to the drawings and specific language will be used to describe various aspects of the disclosure. Using the drawings and description in this manner should not be construed as limiting its scope. Additional aspects may be apparent in light of the disclosure, including the claims, or may be learned by practice.

The present disclosure generally relates to electrical couplings for printed circuit board assemblies and/or optoelectronic modules.

Some printed circuit board assemblies (PCBAs) and/or optoelectronic modules include may include multiple integrated circuits (ICs) to perform various tasks, such as modulating signals for components such as transmitters and receivers, for example. One difficulty with the inclusion of multiple ICs is electrically coupling the electrical contacts on the ICs in a relatively small area, while maintaining suitable electrical couplings between the contacts. As the density of components increases, components such as ICs may be positioned closer to one another, as well as the electrical connections coupling them together. However, designing and manufacturing higher density printed circuit board assemblies and/or optoelectronic modules may lead to additional challenges. The embodiments described herein may address such challenges.

The embodiments described herein can be implemented in various assemblies including PCBAs and optoelectronic modules. As used herein the term "optoelectronic module" includes modules having both optical and electrical components. Examples of optoelectronic module include, but are not limited to, active electrical cables, active optical cables, transponders, transceivers, transmitters, and/or receivers. Optoelectronic module modules can be used, for instance, in telecommunications networks, local area networks, metro area networks, storage area networks, wide area networks, and the like and may be configured to conform with one or more standardized form factors or multi-source agreements ("MSAs"), including QSFP, QSFP+, CXP, CXP2, CFP, XFP, and SFP+ form factors, without restriction. It will be appreciated, however, that the optoelectronic modules need not comply with standardized form factor requirement and may have any size or configuration necessary according to a particular design.

Figure 1A:
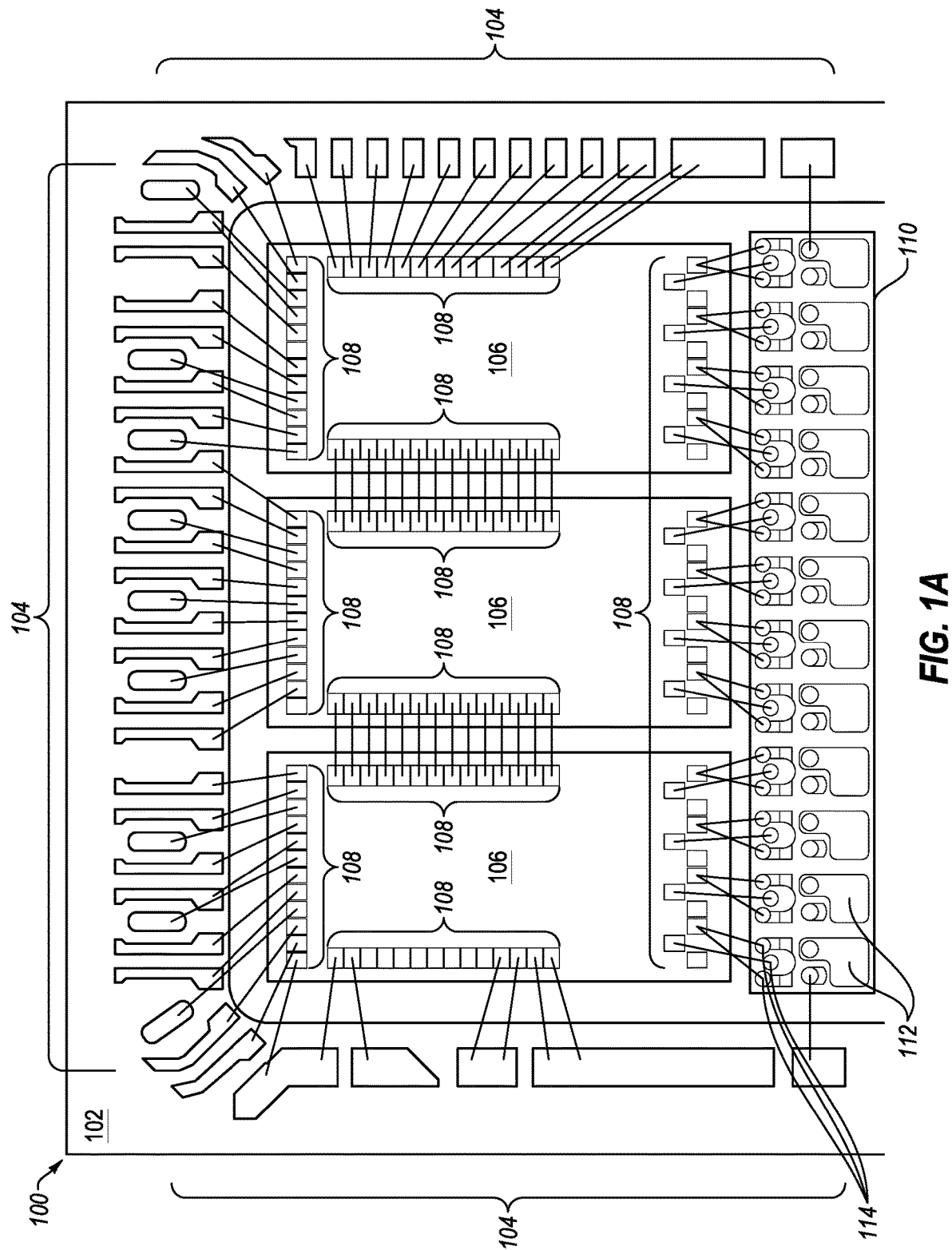
FIG. 1A is a top view of an example printed circuit board assembly.

FIG. 1A is a top view of a PCBA 100. In some configurations, the PCBA 100 may be part of an optoelectronic module. However, the concepts described may be applied to any suitable printed circuit board or electrical bonding configurations. As shown, the PCBA 100 may include a substrate 102 with various electrical contacts or contact pads 104 (only some of which are labeled for illustration). Integrated circuits ("ICs") 106 may be positioned on the substrate 102. The ICs 106 may include electrical contacts or contact pads 108 to electrically couple the ICs 106 to other components. As shown, the contact pads 104 may be positioned on a top surface of the substrate 102, and the contact pads 108 may be positioned on the top surface of the ICs 106. Some of the contact pads 104 may be electrically coupled to the contact pads 108, for example, using wires or other suitable electrical couplings, as represented by lines interconnecting the contact pads 104 and 108. Additionally or alternatively, some of the contact pads 108 of one of the ICs 106 may be electrically coupled to some of the contact pads 108 of another one of the ICs 106, as represented by lines interconnecting the contact pads 108 of the ICs 106.

In configurations where the PCBA 100 is part of an optoelectronic module, the PCBA 100 may include an optoelectronic IC 110 positioned on the substrate 102. The optoelectronic IC 110 may include components that convert optical signals to electrical signals, convert electrical signals to optical signals, or both. For example, the optoelectronic IC 110 may include optoelectronic components 112, which may include optical receivers, optical transmitters, or a combination thereof. Accordingly, the optoelectronic IC 110 may be a receiver array, a transmitter array, or any array with both receivers and transmitters, depending on the desired configuration.

The optoelectronic components 112 may be optically coupled to an optical fiber to receive or transmit optical signals. The optoelectronic components 112 may covert optical signals into corresponding electrical signals, or vice versa. In the illustrated configuration, the optoelectronic components 112 are arranged in a 12×1 array, although other configurations may be implemented. In one example, the optoelectronic components 112 may be vertical cavity surface emitting lasers ("VCSELs") or PIN photodiodes. In other configurations, the optoelectronic components 112 may be other types of optical transmitters, such as edge-emitting lasers, in the same or different quantities or configurations. Additionally or alternatively, the optoelectronic components 112 may be other types of optical receivers in the same or different quantities or configurations.

The optoelectronic IC 110 may include electrical contacts or contact pads 114 to electrically couple the optoelectronic IC 110 to other components. For example, as shown, some of the contact pads 114 may be electrically coupled to the contact pads 108, as represented by lines interconnecting the contact pads 114 and 108. Additionally or alternatively, some of the contact pads 114 may be electrically coupled to the contact pads 104, as represented by lines interconnecting the contact pads 114 and 104.

In the illustrated configuration, the PCBA 100 includes three of the ICs 106. Each of the ICs 106 are coupled to four of the optoelectronic components 112 of the optoelectronic IC 110. The ICs 106 may configured to operate in conjunction with the optoelectronic components 112. For example, in configurations where the optoelectronic components 112 are receivers, the ICs 106 may be transimpedance amplifier ICs. Each of the transimpedance amplifier ICs may function as four transimpedance amplifiers for the optical signals received by four corresponding receivers (e.g., four of the optoelectronic components 112). In another example, in configurations where the optoelectronic components 112 are transmitters, the ICs 106 may be driver ICs. Each of the driver ICs may function as four drivers for four corresponding transmitters (e.g., four of the optoelectronic components 112) to drive the transmitters to transmit optical signals.

Four is one example channel quantity for the ICs 106, and each of the ICs 106 could instead be configured to function in connection with fewer than four or greater than four of the optoelectronic components 112. In addition, any suitable number of the optoelectronic components 112 may be implemented according to the concepts described herein.

The configuration shown in FIG. 1A has relatively high density, with many components (e.g., ICs) positioned close to one another, as well as many contact pads coupled to one another by wires or other electrical couplings. In such configurations, many wires may be positioned close to one another. For example, in some configurations, the pitch between the contact pads 108 may be approximately 65 microns. However, if two wires touch one another, the components will not operate properly and may be damaged (e.g., a short circuit). Accordingly, the configurations described herein decrease the likelihood or eliminate wires from touching one another, to prevent damage and to ensure components operate properly.

In addition, high density configurations, such as the one illustrated in FIG. 1A, may result in fairly large variation in angle between wires. The angle between wires may depend on the spacing between contact pads. A large variation in angle between wires may result in wires or electrical couplings touching one another, because different angles between adjacent wires may cause wires to be close to one another (or close to overlapping one another). Such aspects are described in further detail with respect to FIG. 1B.

Figure 1B:
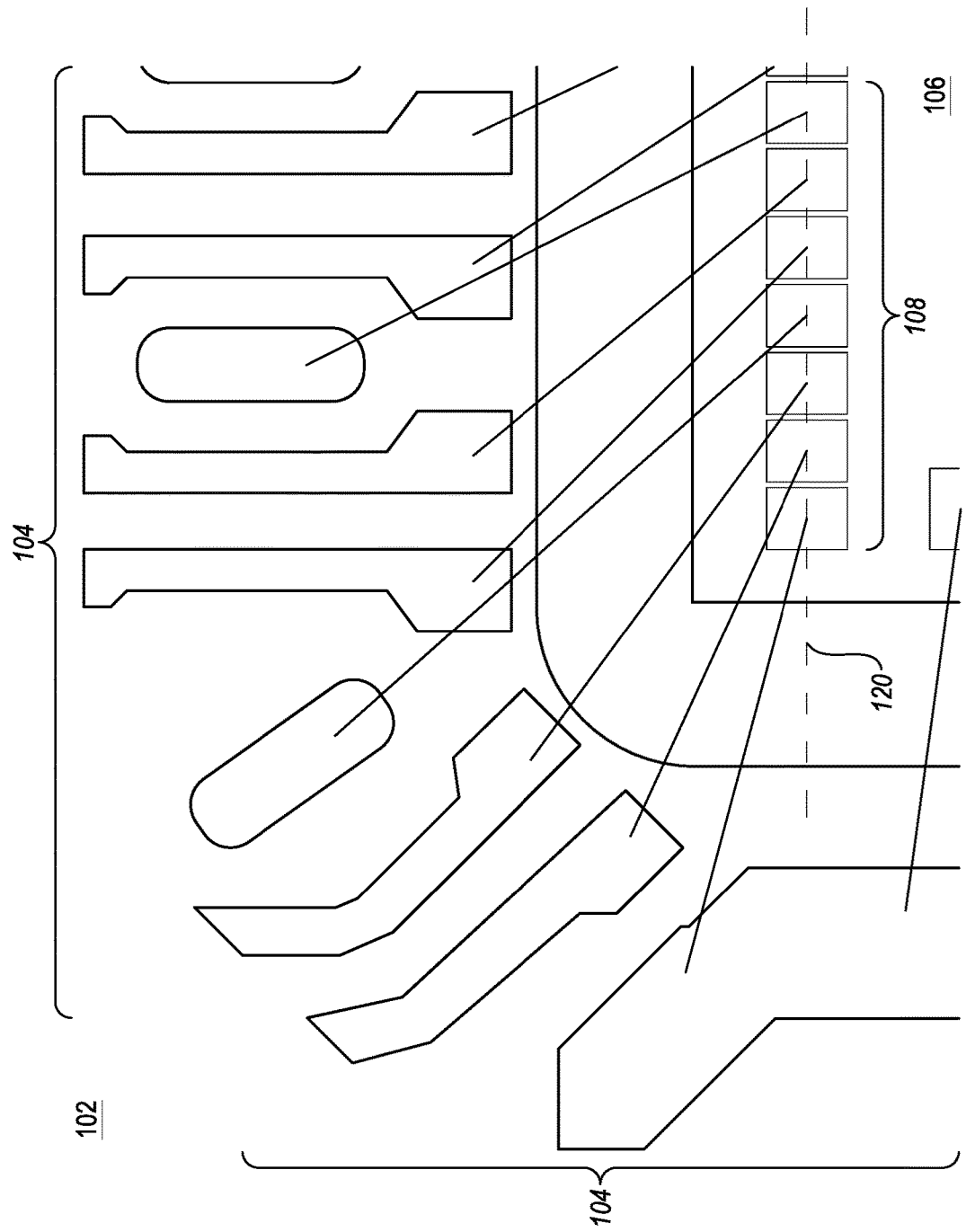
FIG. 1B is a top view of a portion of the printed circuit board assembly of FIG. 1A.

FIG. 1B is a top view of a portion of the PCBA 100. In particular, FIG. 1B illustrates the contact pads 104 of the substrate 102 and the contact pads 108 of one of the ICs 106, and their respective electrical couplings, in further detail. As shown in FIG. 1B, since the illustrated configuration has relatively high density, the wires electrically coupling the contact pads 102 and 108 are positioned relatively close to one another.

The contact pads 108 are arranged in a linear configuration, generally positioned along line 120. In contrast, while some of the contact pads 104 are arranged in a linear configuration, some of the contact pads 104 also extend around the ICs 106 (see FIG. 1A). In other words, the contact pads 104 are positioned around the perimeter or periphery of the ICs 106.

The contact pads 104 are spaced further from one another than the contact pads 108. In such configurations, the wires between the contact pads 104, 108 are positioned at different angles from one another. As shown, this results in the wires being positioned closer to one another in some areas. In contrast, if the wires extended from the contact pads 108 in a perpendicular direction with respect to the line, then the wires would be evenly spaced from one another. However, such configurations may not be suitable in some circumstances. Thus, as shown, the wires may be positioned at different angles, especially proximate the corners of the substrate 102 (for example, as shown in FIG. 1B), where the angles are greater than proximate the linear portions of the contact pads 104.

Figure 2:
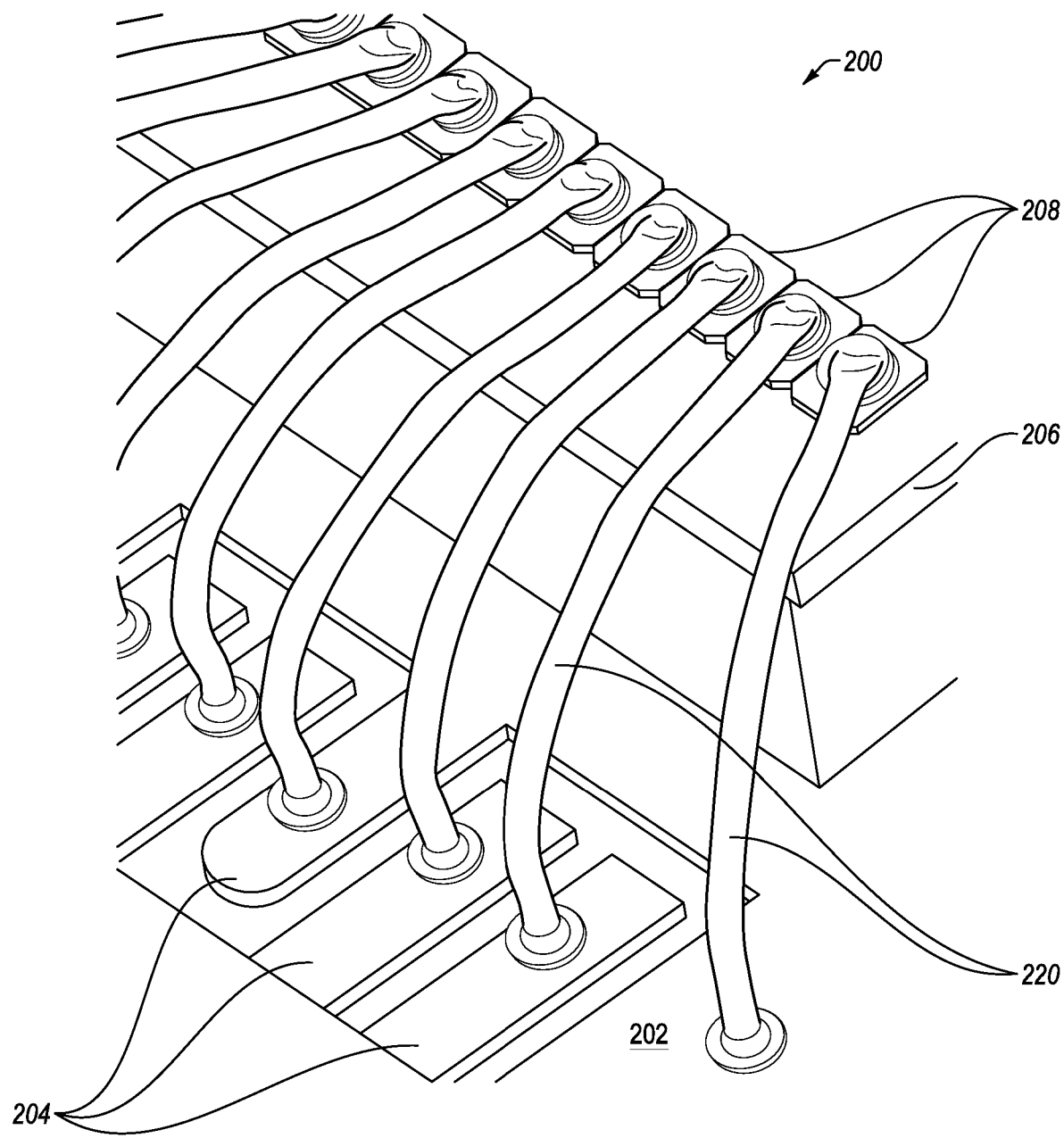
FIG. 2 is a perspective view of a portion of another example of a printed circuit board assembly.

FIG. 2 is a perspective view of a portion of yet another example of a PCBA 200, which may include any suitable aspects described above with respect to the PCBA 100. However, while the FIGS. 1A-1B include lines to represent wires or electrical connections between the contact pads, FIG. 2 illustrates wires 220 in three-dimensional detail. As illustrated, an IC 206 is positioned on a substrate 202. The substrate 202 includes contact pads 204, and the IC 206 includes contact pads 208 positioned thereon. The contacts pads 204 and 208 are electrically coupled to one another by the wires 220. As shown, since the contact pads 208 are positioned relatively close to one another, the wires 220 are also positioned close to one another, thereby increasing the likelihood that two wires touch one another. For example, in some configurations, the pitch between the contact pads 208 may be approximately 65 microns and the diameter of the wire 220 may be approximately 20 microns.

FIG. 3A is a top view of a portion of yet another example of a PCBA 300, which may include any suitable aspects described with respect to the PCBA 100, 200. As illustrated, the PCBA 300 includes wires 320*a-e* coupled to contact pads 208 positioned on an IC 308. However, as shown, the wire 320*a* overlaps the wire 320*b*, and thus may be touching. As explained above, this may cause components coupled by the wires 320*a* and 320*b* to not operate properly and/or may be damaged (e.g., because the wires are shorted). This may result from close spacing of the contact pads 308, the angle of the wires 320*a-e*, and/or the positioning of contact pads at the other end of the wires 320*a-e*.

Figure 3B:
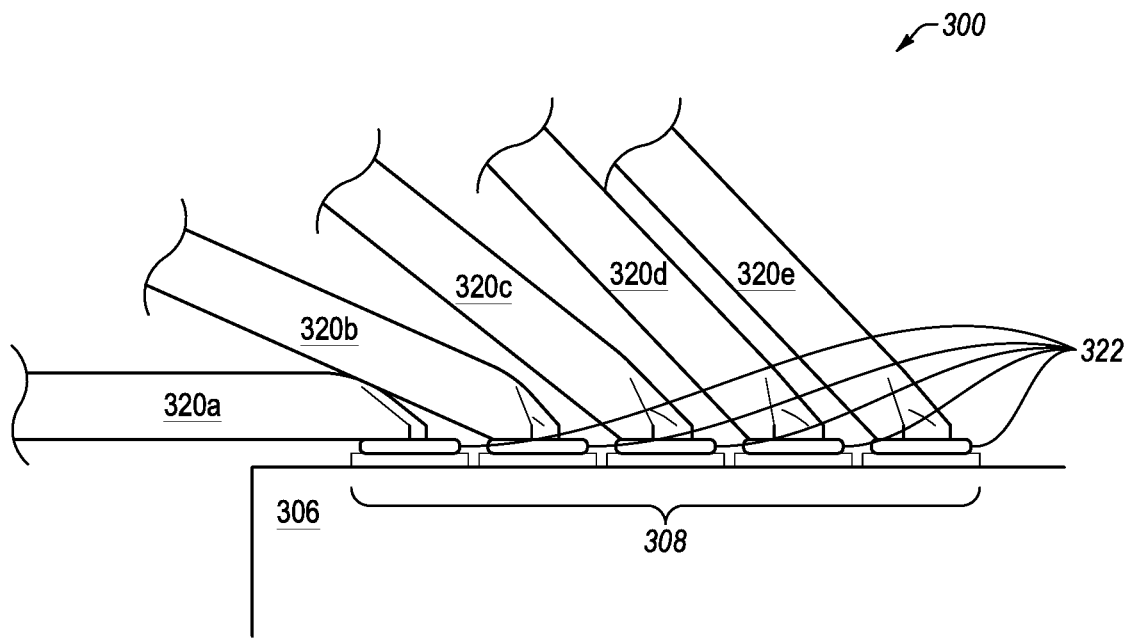
FIG. 3B is a side view of the portion of the printed circuit board assembly of FIG. 3A.

FIG. 3B is a side view of the portion of the PCBA 300 of FIG. 3A. As shown, the wire 320*a* is indeed touching the wire 320*b*. In addition, FIG. 3B illustrates the different angles of the wires 320*a-e* with respect to one another and the IC 306. As shown, the wires 320*a-e* are coupled to the contact pads 308 by stich bonds attached to ball bumps 322. The ball bumps 322 may mechanically and electrically couple the wires 320*a-e* to the contact pads 308. Since each of the ball bumps 322 are substantially the same size, a distance between each of the wires 320*a-e* and the contact pads 308 is substantially the same. However, because of the spacing of the contact pads 308 and the angles of the wires 320*a-e*, some of the wires 320*a-e* are touching one another (e.g., the wire 320*a* and the wire 320*b*).

Figure 3C:
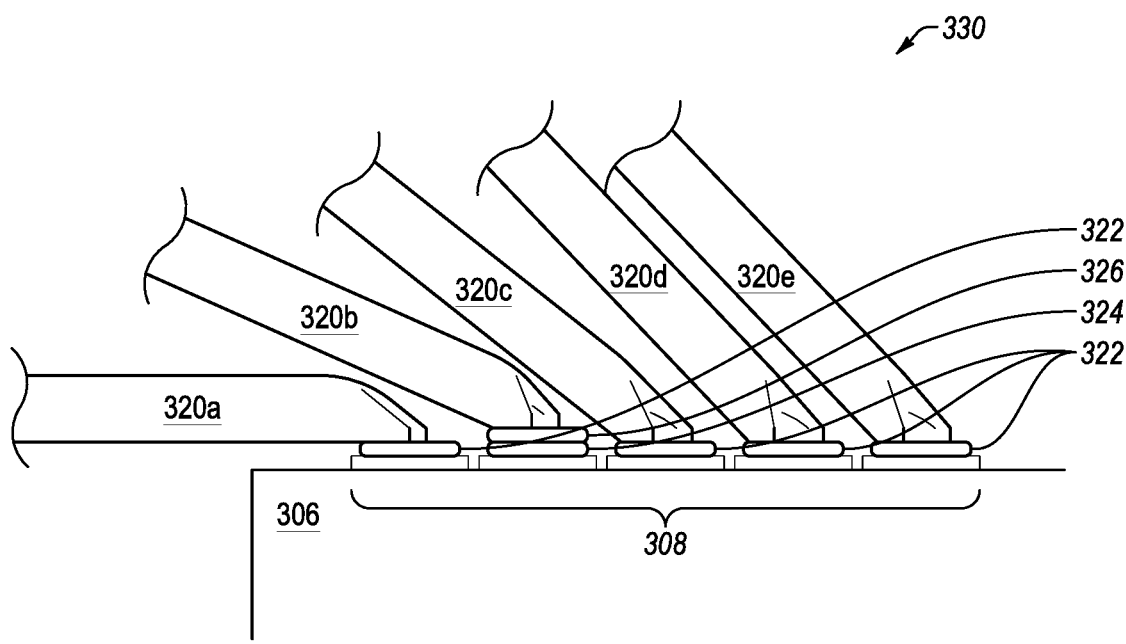
FIG. 3C is a side view of a portion of yet another example of a printed circuit board assembly.

FIG. 3C is a side view of a portion of yet another example of a PCBA 330. The PCBA may include any suitable aspects described above with the respect to the PCBA 300, such as the IC 306, the contact pads 308, and the wires 320*a-e*. As shown, the wires 320*a* and the wires 320*c-e* are coupled to the contact pads 308 with the ball bumps 322, as described above. However, the wire 320*b* is coupled to its respective one of the contact pads 308 by a first ball bump 324 and a second ball bump 326 positioned over the first ball bump 324 (or between the first ball bump 324 and the wire 320*b*). Such configurations may be referred to as a double ball bump coupling the wire 320*b* and its respective one of the contact pads 308. Additionally or alternatively, such configurations may be referred to as a sandwich stich bond, because the first ball bump 324 is sandwiched between the second ball bump 326 and the respective one of the contact pads 308.

As shown, in such configurations the wire 320*b* is spaced apart and not touching the adjacent wires 320*a* and 320*c*. Such configurations may result in staggered or offset configurations of the wires 320*a-e*. In particular, a distance between the wire 320*b* and its respective one of the contact pads 308 is greater than a distance of each of the wires 320*a* and 320*c-e* and the contact pads 308 because the first ball bond 324 and the second ball bond 326, when combined, are larger than the ball bonds 322 by themselves. Such configurations may prevent the wires 320*a-e* from touching one another by compensating for the close positioning of the contact pads 308 and the angles and positions of the wires 320*a-e*. Additionally or alternatively, such configurations may increase the spacing between the wires 320*a-e*, and, in particular, the spacing between the wire 320*b* and the wires 320*a,c*. This may in turn prevent the wires 320*a-e* from shorting and damaging components coupled to the wires 320*a-e*.

Although the concepts described herein include PCBAs used in optoelectronic assemblies, the concepts described may be applied to any suitable printed circuit board or electrical bonding configurations. Accordingly, the concepts described are not limited to any specific type of electrical coupling or electrical interconnect, unless explicitly stated or is apparent from context.

Many different electrical coupling techniques may be implemented to electrically couple components in PCBAs or optoelectronic assemblies. Two common techniques are wire bonding and flip chip (also referred to as controlled collapsed chip connection). Such techniques may be used to electrically couple chips or ICs with a substrate, or ICs with other ICs, or other electrical components. The substrate may be a die, a leadframe or other suitable substrates. Although the use of flip chip interconnects is increasing, ball bonding is currently the most common electrical coupling technique for electrical interconnects. Even with changes in chip package design, wire bonding continues to be a widely-used interconnection method because of its low cost, flexibility, reliability and established infrastructure. Furthermore, wire bonded interconnects generally have good high-speed electrical performance, which may be important for radio frequency (RF) electrical couplings. The wire bonding configurations described utilize relatively short wire lengths and centrally located interconnections that achieve the required on-chip timing for PCBAs and optoelectronic modules.

One common type of wire bonding is ball bonding. In typical ball bonding configurations, a spherical ball bump is formed and attached to a first contact pad using thermal and/or ultrasonic energy to form a first ball bond. Typically the first ball bond is formed on a contact pad of an IC (rather than a substrate or die). Once the first ball bond is formed and attached to the first contact pad, a wire is formed extending from the first ball bond. The wire is extended from the first ball bond along a predefined route to a second contact pad, typically on a substrate or a die (rather than the IC). The second bond at the second contact pad of the substrate is typically a stitch bond that bonds the opposite end of the wire (e.g. a tail bond). In such configurations, the end of the wire is bonded directly to the second contact pad, and a remaining tail is used to form another ball for the next ball bond. The next ball may be formed by ionizing an air gap in a process called electronic flame-off (EFO). The resulting ball may be referred to as a free air ball (FAB).

Another type of wire bonding is stand-off stitch bonding (SSB). SSB typically involves the placement of a first ball bump on a first contact pad. A bonding tool is disconnected from the first ball bump and then positioned over to a second contact pad. A second ball bump is formed and attached to a second contact pad using thermal and/or ultrasonic energy to form a first ball bond. Once the first ball bond is formed and attached to the contact pad, a wire is formed extending from the first ball bond. The wire is extended from the first ball bond along a predefined route to the second contact pad, which already has the first ball bump positioned on it. A stitch bond is formed by stitching off the wire on the previously placed first ball bump, thereby bonding the opposite end of the wire to the second contact pad via the first ball bump. Since the stitched wire is bonded to the first ball bump rather than directly to the contact pad, the resulting interconnect is typically stronger and more homogenous.

Depending on the position of the ball bond and the stitch bond, in some circumstances the resulting electrical coupling may be low-profile and/or compact. In particular, it may be easier to form a stitch bond such that the wire is at a relatively sharp angle with respect to the contact pad. In configurations where the contact pad of the IC is positioned above the contact pad of the substrate (see for example, FIG. 2), positioning a ball bond on the contact pad of the substrate and the stitch bond on the contact pad of the IC may result in an electrical coupling with a low-profile.

FIG. 2 illustrates a configuration where the wires 220 are coupled to the contact pads 204 of the substrate 202 with ball bonds, and the other end of the wires 220 are coupled to the contact pads 208 of the IC 206 with stitch bonds. As shown, the wires 220 extend substantially perpendicularly from the contact pads 204 of the substrate 202, as a result of the ball bonds. In addition, the wires 220 extend substantially laterally from the contact pads 208 of the IC 206, as a result of the stitch bonds. The ball bonds and the stitch bonds of FIG. 2 may be formed according to the processes described above. As shown, the resulting electrical couplings have a relatively low-profile because of the configuration of the ball bonds and stitch bonds.

FIGS. 3A-3B also illustrate configurations where the wires 320*a-e* are coupled to the contact pads 308 of the IC 306 with stitch bonds. As shown, the wires 320*a-e* extend at angles from the contact pads 308 of the IC 306 as a result of the stitch bonds. The stitch bonds of FIGS. 3A-3B may be formed according to the processes described above. As shown, the resulting electrical couplings may have a relatively low-profile, however, since the wires 320*a-e* are positioned relatively close to one another, some of the wires 320*a-e* may touch one another and short out.

As described above, FIG. 3C illustrates an electrical coupling configuration with two ball bumps (e.g., the first ball bump 324 and the second ball bump 326) coupling the wire 320*b* to one of the contact pads 308. In such configurations, the wire 320*b* is spaced apart and not touching the adjacent wires 320*a* and 320*c*. In particular, a distance between the wire 320*b* and its respective one of the contact pads 308 is greater than a distance of each of the wires 320*a* and 320*c-e* and the contact pads 308 because the first ball bond 324 and the second ball bond 326, when combined, are larger than the ball bonds 322 by themselves. In some circumstances, the extra second ball bond 326 may increase the wire tail height of the wire 320*b* by approximately 10 microns (for example, with respect to the tail heights of the wires 320*a* and 320*c-e*). In other words, the second ball bond 326 may increase the distance between the wire 320*b* and the corresponding one of the contact pads 308 by 10 microns, for example, when compared to the distance between the other wires 320a and 320c-e and their corresponding contact pads 308.

As explained above, such configurations may prevent the wires 320a-e from touching one another by compensating for the close positioning of the contact pads 308 (e.g., 20 micron pitch) and the angles and positions of the wires 320a-e. Additionally or alternatively, such configurations may increase the spacing between the wires 320a-e, and, in particular, the spacing between the wire 320b and the wires 320a,c. This may in turn prevent the wires 320a-e from shorting and damaging components coupled to the wires 320a-e.

An example configuration to form the double ball bump or sandwich stitch bond coupling of the wire 320b to its respective one of the contact pads 308 is described as follows. The first ball bump 324 may be formed and positioned on the contact pad 308 (e.g., by a bonding tool). In some configurations, the first ball bump 324 may be coupled to the contact pad 308 using thermal and/or ultrasonic energy. The bonding tool may then be disconnected from the first ball bump 324. The second ball bump 326 may then be formed and positioned over first ball bump 324 (e.g., by a bonding tool). In some configurations, the second ball bump 326 may be coupled to the first ball bump 324 using thermal and/or ultrasonic energy. The bonding tool may then be disconnected from the second ball bump 326.

After the first ball bump 324 and the second ball bump 326 are formed and attached to the contact pad 308, a third ball bump may be formed and attached to a contact pad of a substrate (see, for example, FIGS. 1A-1B and FIG. 2). The third ball bump may be attached to its corresponding contact pad of the substrate using thermal and/or ultrasonic energy to form a first ball bond. After the first ball bond is formed and attached to the contact pad, the wire 320b may be formed extending from the first ball bond. The wire 320b may be formed extending from the first ball bond along a predefined route to the contact pad 308, which already has the first ball bump 324 and the second ball bump 326 positioned on it. A stitch bond may be formed by stitching off the wire 320b on the previously placed second ball bump 326, thereby bonding the wire 320n to the contact pad 308 via both the first ball bump 324 and the second ball bump 326. Since the stitched wire is bonded to the first ball bump 324 and the second ball bump 326, the wire 320b is offset or staggered with respect to the other wires 320a and 320c-e.

Figure 4:
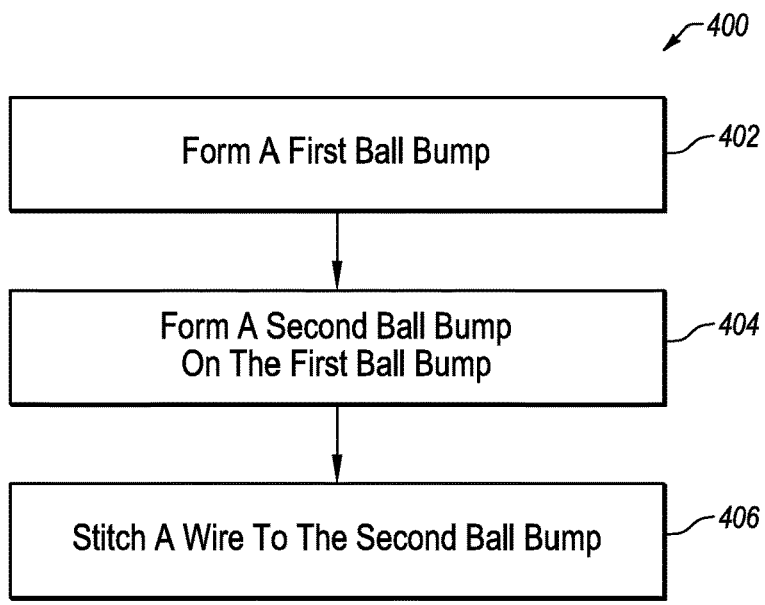
FIG. 4 is a flow chart of an example embodiment of a method.

FIG. 4 illustrates a method 400 of forming a PCBA, an optoelectronic module, an electrical coupling, and/or a high speed interconnect. The method 400 may begin at step 402, in which a first ball bump may be formed on a contact pad of an integrated circuit. At step 404, a second ball bump may be formed on the first ball bump. At step 406, a wire may be stitched to the second ball bump.

In some embodiments, a bonding tool may be disconnected from the first ball bump prior to forming the second ball bump. The method 400 may include forming a third ball bump on a second contact pad of a substrate, and extending a wire from the third ball bump along a predefined route to the second ball bump to electrically couple the contact pad of the integrated circuit with the second contact pad of the substrate. The integrated circuit may be positioned over and mechanically coupled to the substrate. In some embodiments, the bonding tool may be disconnected from the second ball bump prior to forming the third ball bump.

The method 400 may include forming a third ball bump on a second contact pad of the integrated circuit. The second contact pad may be positioned adjacent to and spaced apart from the contact pad. The method 400 may further include stitching a second wire to the third ball bump on the second contact pad. Additionally or alternatively, the method 400 may include any of the concepts described above, as may be applicable.

Figure 5:
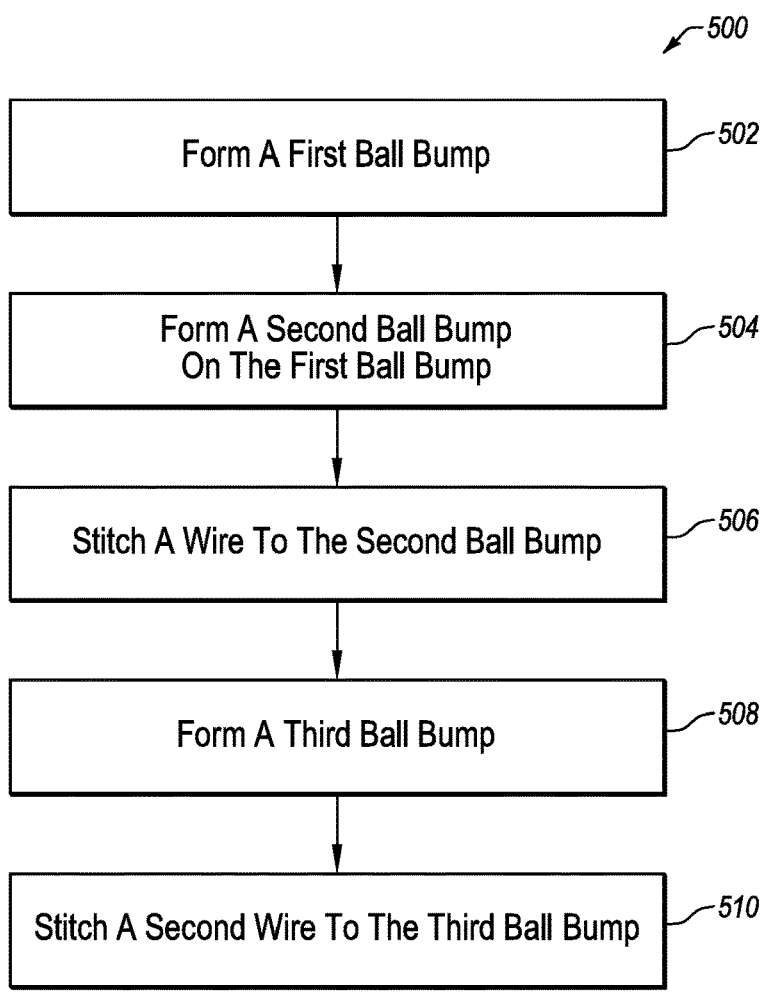
FIG. 5 is a flow chart of another example embodiment of a method.

FIG. 5 illustrates a method 500 of forming a PCBA, an optoelectronic module, an electrical coupling, and/or a high speed interconnect. The method 500 may include coupling a first wire to a first contact pad of an integrated circuit, and coupling a second wire to a second contact pad adjacent to and spaced apart from the first contact pad. The method may begin at step 502, in which a first ball bump may be formed on a first contact pad of an integrated circuit. At step 504, a second ball bump may be formed on the first ball bump. At step 506, a first wire may be stitched to the second ball bump. Steps 502, 504 and 506 may couple the first wire to the first contact pad of the integrated circuit.

The method may continue to step 508, in which a third ball bump may be formed on the second contact pad of the integrated circuit. At step 510, a second wire may be stitched to the third ball bump.

In some embodiments, the first wire may be positioned further from the first contact pad than the second wire is positioned from the second contact pad as a result of the first ball bump and the second ball bump. The first ball bump and the second ball bump combined may be larger than the third ball bump.

The method 500 may include ball bonding the first wire to a third contact pad of a substrate prior to stitching the first wire to the second ball bump, and ball bonding the second wire to a fourth contact pad of the substrate prior to stitching the second wire to the third ball bump. The integrated circuit may be positioned over and mechanically coupled to the substrate. Additionally or alternatively, the method 500 may include any of the concepts described above, as may be applicable.

In one example embodiment, a PCBA, an optoelectronic module, an electrical coupling, and/or a high speed interconnect may include a first contact pad, a second contact pad adjacent to and spaced apart from the first contact pad, a first wire coupled to the first contact pad via a first ball bump, and a second wire coupled to the second contact pad via a double ball bump.

In some embodiments, the double ball bump may include a second ball bump positioned on the second contact pad, and a third ball bump positioned over the second ball bump. The combination of the second ball bump and the third ball bump may space the second wire from the second contact pad more than the first ball bump spaces the first wire from the first contact pad. The first wire may be stitched to the first ball bump and the second wire may be stitched to the double ball bond.

The first contact pad and the second contact pad may be positioned on an integrated circuit positioned over a substrate. The integrated circuit may include a driver electrically coupled to an optical transmitter or an amplifier electrically coupled to an optical receiver.

The first wire may be coupled to a third contact pad on the substrate and the second wire may be coupled to a fourth contact pad on the substrate. A pitch between the third contact pad and the fourth contact pad may be greater than a pitch between the first contact pad and the second contact pad.

The double ball bump may be about twice as tall as the first ball bump. The combination of the first ball bump and the double ball bump may space the first wire from the second wire. The first wire and the second wire may be angled with respect to one another, and the combination of the first ball bump and the double ball bump may provide sufficient clearance for angles of the first wire and the second wire.

The concepts described herein may result in higher yield of PCBAs, optoelectronic modules, electrical couplings, and/or a high speed interconnects because adjacent wires may be less likely to touch one another. Accordingly, processes incorporating the concepts described may be easier to manufacturer in a manner that results in higher yields. Furthermore, the concepts described do not significantly increase manufacturing costs and may be compatible with existing manufacturing processes. In addition, the concepts described may be implemented in existing products and their respective production processes. Incorporating the concepts described in existing products may not require significant changes to existing production processes.

In some circumstances, the concepts described herein may be applicable for coupling RF lines or high speed interconnects. In such circumstances, the wires may be RF lines or high speed lines. Such lines may be relatively sensitive to RF interference, impendence, and/or other undesirable electrical interference. Additionally or alternatively, changing the length of such lines may adversely affect the RF performance of such electrical lines. Although the double bump and/or sandwich configurations described herein may slightly increase the length of RF lines incorporating such configurations, the increased length may not be significant enough to decrease RF performance. Additionally or alternatively, the increase in length may be relatively predictable (e.g., each ball bump may be approximately the same size), therefore, the length increase may be accounted for when designing electrical interconnects. Accordingly, the concepts described herein may be implemented for high speed interconnects with suitable RF performance for high speed electrical lines.

For the processes and/or methods disclosed, the functions performed in the processes and methods may be implemented in differing order as may be indicated by context. Furthermore, the outlined steps and operations are only provided as examples, and some of the steps and operations may be optional, combined into fewer steps and operations, or expanded into additional steps and operations.

The terms and words used in the description and claims are not limited to the bibliographical meanings, but, are merely used to enable a clear and consistent understanding of the disclosure. It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those skilled in the art, may occur in amounts that do not preclude the effect the characteristic was intended to provide.

Aspects of the present disclosure may be embodied in other forms without departing from its spirit or essential characteristics. The described aspects are to be considered in all respects illustrative and not restrictive. The claimed subject matter is indicated by the appended claims rather than by the foregoing description. All changes which come within the meaning and range of equivalency of the claims are to be embraced within their scope.

What is claimed is:

1. An optoelectronic module comprising:
   a first contact pad disposed at a corner on a surface of the module;
   a second contact pad disposed on the surface adjacent to and spaced apart from the first contact pad and disposed on a line from the first contact pad along an edge of the surface;
   a third contact pad disposed on the surface adjacent to and spaced apart from the second contact pad and disposed on the line;
   a first wire coupled to the first contact pad via a first ball bump and disposed at a first angle relative to the surface;
   a second wire coupled to the second contact pad via a double ball bump and disposed at a second angle relative to the surface, the second angle being greater than the first angle; and
   a third wire coupled to the third contact pad via a third ball bump and disposed at a third angle relative to the surface the third angle being greater than the second angle.

2. The optoelectronic module of claim 1, the double ball bump comprising:
   a second ball bump positioned on the second contact pad; and
   an additional ball bump positioned over the second ball bump.

3. The optoelectronic module of claim 2, wherein the combination of the second ball bump and the additional ball bump spaces the second wire from the second contact pad more than the first ball bump spaces the first wire from the first contact pad.

4. The optoelectronic module of claim 1, wherein the first wire is stitched to the first ball bump, the second wire is stitched to the double ball bump, and the third wire is stitched to the third ball bump.

5. The optoelectronic module of claim 1, wherein the first contact pad, the second contact pad, and the third contact pad are positioned on the surface of an integrated circuit positioned over a substrate.

6. The optoelectronic module of claim 5, wherein the integrated circuit comprises:
   a driver electrically coupled to an optical transmitter; or
   an amplifier electrically coupled to an optical receiver.

7. The optoelectronic module of claim 5, wherein the first wire is coupled to a fourth contact pad on the substrate, the second wire is coupled to a fifth contact pad on the substrate, and the third wire is coupled to a sixth contact pad on the substrate.

8. The optoelectronic module of claim 7, wherein a pitch between the fourth contact pad and the fifth contact pad is greater than a pitch between the first contact pad and the second contact pad.

9. The optoelectronic module of claim 1, wherein the double ball bump is about twice as tall as the first ball bump.

10. The optoelectronic module of claim 1, wherein the combination of the first ball bump and the double ball bump spaces the first wire from the second wire.

11. The optoelectronic module of claim 1, wherein the combination of the first ball bump and the double ball bump provides sufficient clearance for the first and second angles of the first wire and the second wire.

12. A method of forming an electrical coupling for an optoelectronic module comprising:
- forming a first ball bump on a first contact pad at a corner of an integrated circuit of the optoelectronic module; and
- stitching a first wire at a first angle to the first ball bump on the first contact pad;
- forming a second ball bump on a second contact pad of the integrated circuit, the second contact pad disposed adjacent to and spaced apart from the first contact pad and disposed on a line from the first contact pad along an edge of the integrated circuit;
- forming an additional ball bump on the second ball bump; and
- stitching a second wire at a second angle to the additional ball bump, the second angle being greater than the first angle;
- forming a third ball bump on a third contact pad of the integrated circuit, the third contact pad disposed adjacent to and spaced apart from the second contact pad and disposed on the line; and
- stitching a third wire at a third angle to the third ball bump on the third contact pad, the third angle being greater than the second angle.

13. The method of claim 12, further comprising disconnecting a bonding tool from the second ball bump prior to forming the additional ball bump.

14. The method of claim 12, further comprising:
- forming a fourth ball bump on a fourth contact pad of a substrate, wherein the integrated circuit is positioned over and mechanically coupled to the substrate; and
- extending the second wire from the fourth ball bump along a predefined route to the additional ball bump to electrically couple the contact pad of the integrated circuit with the second contact pad of the substrate.

15. The method of claim 14, further comprising disconnecting a bonding tool from the additional ball bump prior to forming the third ball bump.

16. A method comprising:
- coupling a first wire to a first contact pad at a corner of an integrated circuit, comprising:
  - forming a first ball bump on the first contact pad of the integrated circuit; and
  - stitching the first wire at a first angle to the first ball bump;
- coupling a second wire to a second contact pad of the integrated circuit, the second contact pad being adjacent to and spaced apart from the first contact ad and disposed on a line from the first contact pad along an edge of the integrated circuit, comprising:
  - forming a second ball bump on the second contact pad of the integrated circuit;
  - forming an additional ball bump on the second ball bump; and
  - stitching the second wire at a second angle to the additional ball bump, the second angle being greater than the first angle;
- coupling a third wire to a third contact pad adjacent to and spaced apart from the second contact pad and disposed on the line, comprising:
  - forming a third ball bump on the third contact pad of the integrated circuit; and
  - stitching a third wire at a third angle to the third ball bump, the third angle being greater than the second angle.

17. The method of claim 16, wherein the second wire is positioned further from the second contact pad than the third wire is positioned from the third contact pad as a result of the second and additional ball bumps.

18. The method of claim 16, wherein the second ball bump and the additional ball bump combined are larger than the first or third ball bumps.

19. The method of claim 16, further comprising:
- ball bonding the second wire to a fourth contact pad of a substrate prior to stitching the second wire to the additional ball bump, the integrated circuit positioned over and mechanically coupled to the substrate; and
- ball bonding the third wire to a fifth contact pad of the substrate prior to stitching the third wire to the third ball bump.

* * * * *